United States Patent
Penka et al.

(10) Patent No.: US 6,232,220 B1
(45) Date of Patent: May 15, 2001

(54) METHOD FOR FABRICATING A SEMICONDUCTOR COMPONENT HAVING A LOW CONTACT RESISTANCE WITH RESPECT TO HEAVILY DOPED ZONES

(75) Inventors: Volker Penka, Unterhaching; Reinhard Mahnkopf, München; Helmut Wurzer, Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/232,868

(22) Filed: Jan. 15, 1999

Related U.S. Application Data

(63) Continuation of application No. PCT/DE97/01461, filed on Jul. 10, 1997.

(30) Foreign Application Priority Data

Jul. 15, 1996 (DE) .............................. 196 28 459

(51) Int. Cl.$^7$ ................................. H01L 21/4763
(52) U.S. Cl. .................. 438/637; 438/637; 438/638; 438/639; 438/640; 438/622; 438/618; 438/619; 438/620; 438/621; 438/597; 438/675; 438/624; 257/758
(58) Field of Search ............... 438/637–40, 622–618, 438/597, 675, 624; 257/758

(56) References Cited

U.S. PATENT DOCUMENTS

| | | |
|---|---|---|
| 5,198,373 | 3/1993 | Yoshino . |
| 5,225,357 | 7/1993 | Ho . |
| 5,296,386 | 3/1994 | Aronowitz et al. . |
| 5,466,612 | 11/1995 | Fuse et al. . |
| 5,498,768 | 3/1996 | Nishitai et al. . |
| 5,591,672 * | 1/1997 | Lee et al. .............................. 437/190 |
| 5,691,220 * | 11/1997 | Ohnishi et al. ........................ 437/52 |
| 5,714,788 * | 2/1998 | Ngaoaram ............................. 257/411 |
| 5,960,321 * | 9/1999 | Hsieh et al. .......................... 438/699 |
| 5,963,812 * | 10/1999 | Kataoka et al. ....................... 438/304 |

FOREIGN PATENT DOCUMENTS

| | | | |
|---|---|---|---|
| 02027716 * | 7/1988 | (JP) ...................................... 438/766 |
| 05021748 * | 7/1991 | (JP) ...................................... 257/296 |
| 7249763 | 9/1995 | (JP) . |

OTHER PUBLICATIONS

S. Wolf & R. Tauber, Silicon Processing, Lattice press, 198, p. 280.*

"A Highly Reliable Interconnection for a $BF_2$–Implanted Junction Utilizing a TiN/Ti Barrier Metal System", Takeo Maeda et al., IEEE Transactions on Electron Devices, vol. EC–34, No. 3, Mar. 1987, pp. 599–606.

"Effects of $BF_2$–implants on titanium silicide formation by rapid thermal annealing", J.S. Choi et al., J. Appl. Phys. 72(1), Jul. 1, 1992, pp. 297–299.

(List continued on next page.)

*Primary Examiner*—Matthew Smith
*Assistant Examiner*—Granvile D Lee, Jr.
(74) *Attorney, Agent, or Firm*—Herbert L. Lerner; Laurence A. Greenberg; Werner H. Stemer

(57) ABSTRACT

A method for fabricating a semiconductor component having a low contact resistance with respect to heavily doped or siliconized zones in a semiconductor body. Fluorine ions are implanted into the heavily doped or siliconized zone in the vicinity of a contact hole before a titanium layer is applied to the heavily doped or siliconized zone in the vicinity of the contact hole. As a result of the fluorine, any oxide layers present in the contact hole region can be broken up by less titanium, with the result that a thinner titanium layer is sufficient. In addition, the formation of titanium silicide in the contact hole is promoted.

6 Claims, 1 Drawing Sheet

OTHER PUBLICATIONS

"Collimated sputtering of TiN/Ti liners into sub–half–micrometer high aspect ratio contacts/lines", R.V. Joshi et al., Appl. Phys. Lett. 61 (21), Nov. 23, 1992, pp. 2613–2615.

"Electrical Characteristics and Contact Resistance of $B^+$–and $BF_2^+$–Implanted Silicon Diodes with Furnace and Rapid Thermal Annealing", M. Simard–Normandin, IEEE Transactions on Electron Devices, vol. ED–32, No. 7, Jul. 1985.

C.H. Chu: "Formation of Surface Inversion layer in $F^+$–Implanted n–Type Silicon", Journal of Crystal Growth, vol. 103 (1990), pp. 188–196.

* cited by examiner

Fig. 1
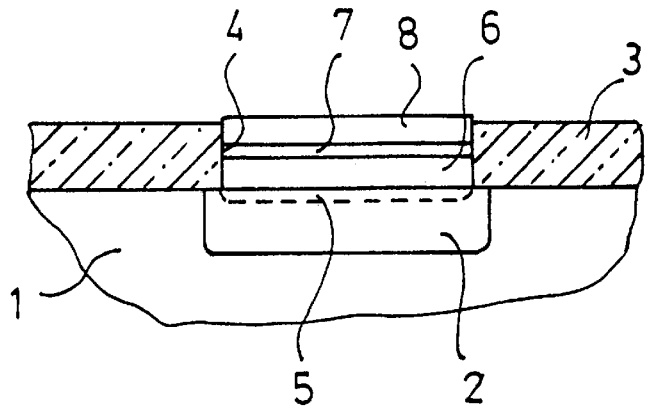
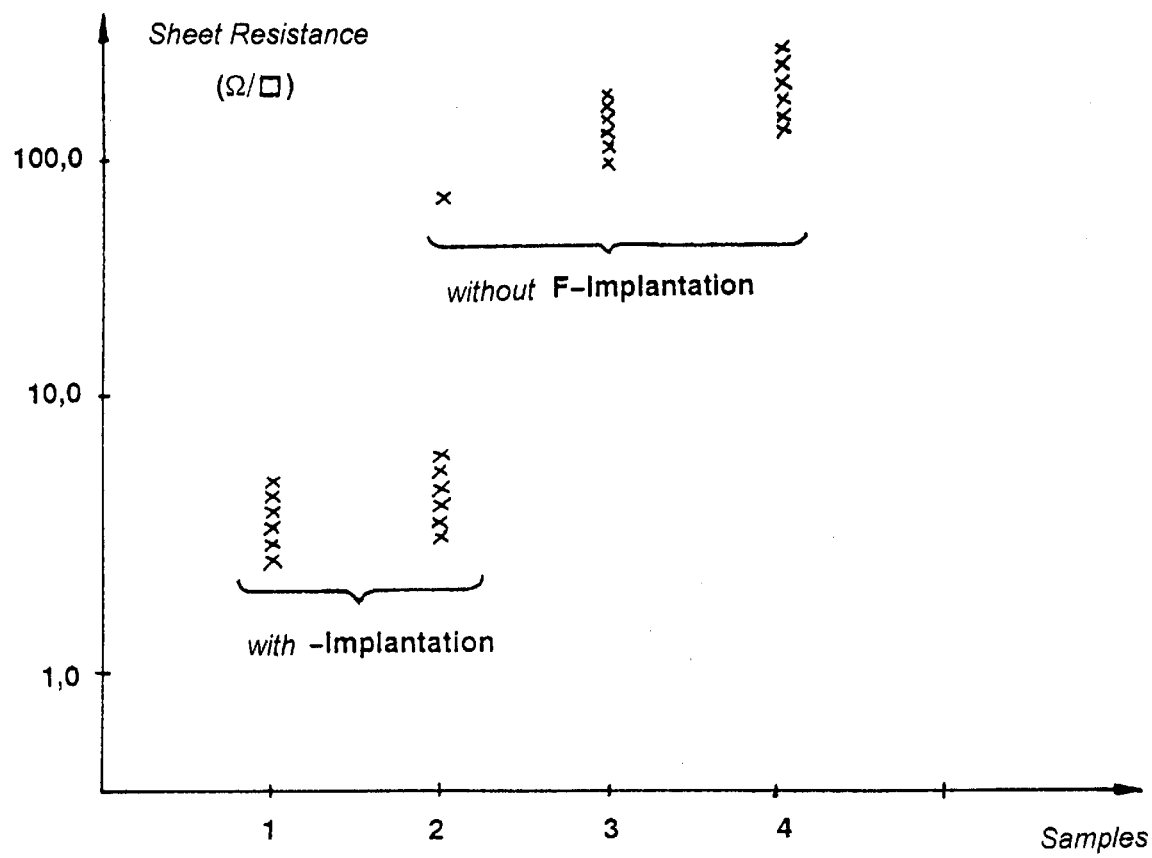
Fig. 2

METHOD FOR FABRICATING A SEMICONDUCTOR COMPONENT HAVING A LOW CONTACT RESISTANCE WITH RESPECT TO HEAVILY DOPED ZONES

CROSS-REFERENCE TO RELATED APPLICATION

This application is a continuation of copending International Application No. PCT/DE97/01461, filed Jul. 10, 1997, which designated the United States.

BACKGROUND OF THE INVENTION

Field of the Invention

The invention relates to a method for fabricating a semiconductor component having a low contact resistance with respect to $n^+$-conducting or $p^+$-conducting, heavily doped zones in a semiconductor body, in which at least one titanium-containing layer is provided in a contact hole between the heavily doped zone and a contact metal connected to an external supply line.

Such a method is disclosed in U.S. Pat. No. 5,225,357. In that case, $n^+$-conducting or $p^+$-conducting, heavily doped zones are present which are connected, in a contact hole, to an external supply line through at least one titanium-containing layer and a contact metal applied thereto. Halogen is introduced into the heavily doped zones in the vicinity of the contact hole in order to reduce the contact resistance with respect to the heavily doped zone.

Furthermore, the implantation of fluorine ions in n-conducting silicon is described in a paper entitled: "Formation of Surface Inversion Layer in $F^+$-Implanted n-Type Silicon", by C. H. Chu et al., in Journal of Crystal Growth, Vol. 103, No. 1/4 (June 1990), Amsterdam, NL, pages 188 to 196.

In contact holes, a titanium layer and/or a titanium nitride layer serves as a barrier layer or layers in order to avoid diffusion from the semiconductor body into a contact layer, which is preferably composed of tungsten. Contacts of that type having a titanium/titanium nitride/tungsten layer sequence are provided, for example, on source and drain zones of CMOS transistors.

The contact resistance is undesirably large, particularly in contact holes having what is referred to as a high aspect ratio, that is to say a high value of the ratio between height and width of the contact hole. The same also applies to siliconized diffusion zones, that is to say zones formed by the reaction of silicon with titanium to form titanium silicide.

Increasing the layer thickness of the titanium layer would be conceivable for reducing the contact resistance. However, that is undesirable since the necessary layer thickness of the titanium layer should actually be reduced if only for reasons of saving material and microminiaturization.

Finally, thin oxide layers which are inevitably formed in the contact hole in the course of thermal processes also lead to disruptive effects and, in particular, to an increase in the contact resistance.

In addition to increasing the layer thickness of the titanium layer as mentioned above, consideration has also been given to collimated sputtering of titanium for forming the titanium layer, in order to ensure a reduction in the contact resistance. Another solution approach for decreasing the contact resistance is in the application of an additional sputtering and heat-treatment step for siliconizing the bottom of the contact hole. However, those two last-mentioned solution approaches for reducing the contact resistance, namely collimated sputtering of titanium and siliconization, are relatively complicated and have not yet achieved the desired results of a contact resistance which is sufficiently reduced in a simple manner.

SUMMARY OF THE INVENTION

It is accordingly an object of the invention to provide a method for fabricating a semiconductor component in which a contact resistance with respect to heavily doped or siliconized diffusion zones is decreased in a simple manner in conjunction with a reduced layer thickness of a titanium layer, which causes no disruptive effect of thin oxide layers and which overcomes the herein afore-mentioned disadvantages of the heretofore-known methods of this general type.

With the foregoing and other objects in view there is provided, in accordance with the invention, a method for fabricating a semiconductor component, which comprises producing an $n^+$-conducting or $p^+$-conducting, heavily doped or siliconized zone in a semiconductor body through a contact hole in a masking layer; implantating fluorine ions in the vicinity of the contact hole into a surface region of the heavily doped or siliconized zone; and subsequently applying at least one titanium-containing layer in the contact hole and applying a contact metal.

In the case of the semiconductor component according to the invention, fluorine is introduced into the heavily doped zone or siliconized zone by ion implantation. The fluorine then leads to an increased efficacy of the titanium which is subsequently sputtered into the contact hole. Any oxide layers in the contact hole which are formed in the course of thermal processes can be broken up by less titanium, and the formation of titanium silicide in the contact hole is promoted. Overall, the contact resistance is thus reduced.

In accordance with another mode of the invention, the fluorine is implanted with a dose of about $10^{12}$ to $10^{16}$ ions/cm$^2$. A greater concentration of fluorine does not afford any further significant improvement in the contact resistance, whereas a lesser concentration does not sufficiently increase the efficacy of the sputtered titanium.

In accordance with a further mode of the invention, the layer sequence in the contact hole includes a titanium film, a titanium nitride film applied thereto, and a tungsten layer.

In accordance with an added mode of the invention, the fluorine ions are implanted into the semiconductor body through the contact hole at an accelerating voltage of about 5 to 50 keV, and a titanium layer and a tungsten layer are then applied to the semiconductor body in the contact hole in a conventional manner.

Implanting fluorine ions in the heavily doped or siliconized zone thus achieves an increased efficacy of the titanium which is sputtered into the contact hole. As a result, any oxide layers that are present are broken up by less titanium and the formation of titanium silicide in the contact hole is facilitated, thereby achieving an appreciable reduction in the contact resistance.

In accordance with a concomitant mode of the invention, there is provided a method which comprises applying the titanium film with a layer thickness of 10 to 100 nm, in particular 40 nm.

Other features which are considered as characteristic for the invention are set forth in the appended claims.

Although the invention is illustrated and described herein as embodied in a method for fabricating a semiconductor component having a low contact resistance with respect to heavily doped zones, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, sectional view illustrating a contact hole in a semiconductor body; and FIG. 2 is a diagram showing experimental results for the invention in comparison with the prior art.

DESCRIPTION OF THE PREFERRED EMBODIMENTS

Referring now to the figures of the drawings in detail and first, particularly, to FIG. 1 thereof, there is seen a section which is taken, for example, through a region of a source or drain zone 2 of a CMOS transistor in a semiconductor body 1. The zone 2 is heavily doped and has a doping concentration of about $10^{21}$ atoms/cm$^3$. An n$^+$-type zone or a p$^+$type zone may be involved in this case. With the exception of a contact hole 4 leading to the zone 2, the semiconductor body 1 is covered with a masking layer 3. The zone 2 can be introduced into the semiconductor body 1 in a customary manner, for example by diffusion through the contact hole 4.

What is essential about the present invention, then, is that fluorine ions are implanted into a surface region of the zone 2 in the vicinity of the contact hole 4 in that zone. The dose of the fluorine in the zone 2 is about $10^{12}$ to about $10^{16}$ in this case. This region implanted with fluorine in the zone 2 is indicated by a dashed line 5.

After the fluorine implantation, a titanium layer 6, a titanium nitride layer 7 and a tungsten layer 8 are formed in the contact hole 4 in a customary manner. An aluminum track is then applied to the tungsten layer 8 as an external supply line.

It has been shown that fluorine is particularly effective for reducing contact resistance. However, if appropriate, other halogens may also be used to achieve comparable results.

In any event the effect of the fluorine implanted into the zone 2 is that oxide layers present in the contact hole 4 can be broken up by less titanium, with the result that the titanium layer 6 can be sputtered on more thinly as a whole. In addition, the formation of titanium silicide in a region between the zone 2 and the titanium layer 6 is promoted, which in turn reduces the contact resistance.

The advantages of the present invention will also be explained now with reference to FIG. 2, which shows a diagram with experimental results.

A titanium layer having a thickness of 40 nm was sputtered onto a densified TEOS layer (TEOS=tetraethyl orthosilicate) having a thickness of 65 nm and was then siliconized, on large-area test structures with a total of four samples 1–4. The wafers of samples 1 and 2 with fluorine implantation exhibit a greatly reduced sheet resistance (between about 5 and 9 Ω/□), whereas wafers without fluorine implantation, namely samples 3 and 4 and a measured value of sample 2, yield the customary high sheet resistance on the order of magnitude of 100 Ω/□, on p$^+$-doped diffusion zones. As a result of the fluorine implantation, the sheet resistance is actually reduced to such an extent that it corresponds to the sheet resistance of pure siliconized zones without a barrier layer.

The invention thus makes it possible to provide a semiconductor component in which the contact resistance between a heavily doped zone and a titanium barrier layer is greatly reduced. All that is necessary for this purpose is fluorine implantation, which, incidentally, can be performed through the contact window which is present in any case for the diffusion of the heavily doped zone. Therefore, the reduction in the contact resistance is achieved in an extremely simple manner. Collimated titanium sputtering or siliconization of the bottom of the contact hole are not necessary. In addition, the undesirable increasing of the layer thickness of the titanium layer can be avoided, without diminishing the ability of the titanium layer to break up oxide layers formed in the contact hole.

We claim:

1. A method for fabricating a semiconductor component, which comprises the following method steps:

producing an n$^+$-conducting or p$^+$-conducting, heavily doped or siliconized zone in a semiconductor body through a contact hole in a masking layer;

implantating fluorine ions in the vicinity of the contact hole into a surface region of the heavily doped or siliconized zone; and subsequently applying at least one titanium-containing layer in the contact hole and applying a contact metal.

2. The method according to claim 1, which comprises carrying out the step of implantating the fluorine with a dose of $10^{12}$ to $10^{16}$ ions/cm.

3. The method according to claim 1, which comprises carrying out the step of implantating the fluorine with an energy of 5 to 50 keV.

4. The method according to claim 1, which comprises carrying out the step of applying the at least one titanium-containing layer by applying a titanium film and applying a titanium nitride film on top of the titanium film.

5. The method according to claim 4, which comprises carrying out the step of applying the titanium film with a layer thickness of 10 to 100 nm.

6. The method according to claim 4, which comprises carrying out the step of applying the titanium film with a layer thickness of 40 nm.

* * * * *